United States Patent
Machiyama

(10) Patent No.: US 7,962,300 B2
(45) Date of Patent: Jun. 14, 2011

(54) BATTERY STATE JUDGING METHOD, AND BATTERY STATE JUDGING APPARATUS

(75) Inventor: Yoshiaki Machiyama, Fukaya (JP)

(73) Assignee: Shin-Kobe Electric Machinery Co., Ltd., Tokyo (JP)

( * ) Notice: Subject to any disclaimer, the term of this patent is extended or adjusted under 35 U.S.C. 154(b) by 571 days.

(21) Appl. No.: 12/097,250

(22) PCT Filed: Dec. 12, 2006

(86) PCT No.: PCT/JP2006/324744
§ 371 (c)(1),
(2), (4) Date: Jun. 12, 2008

(87) PCT Pub. No.: WO2007/069595
PCT Pub. Date: Jun. 21, 2007

(65) Prior Publication Data
US 2009/0171600 A1    Jul. 2, 2009

(30) Foreign Application Priority Data
Dec. 14, 2005  (JP) ................................. 2005-359758

(51) Int. Cl.
*G01R 31/36* (2006.01)
(52) U.S. Cl. ........................................................ 702/63
(58) Field of Classification Search ..................... 702/63
See application file for complete search history.

(56) References Cited

U.S. PATENT DOCUMENTS
5,635,842 A * 6/1997 Yokoo et al. .................. 324/427
2004/0135581 A1   7/2004 Blessing et al.

FOREIGN PATENT DOCUMENTS
| JP | 2000-163129 A | 6/2000 |
| JP | 2003-129927 A | 5/2003 |
| JP | 2004-42799 A | 2/2004 |
| JP | 2004-301778 A | 10/2004 |
| JP | 2005-304173 A | 10/2005 |

OTHER PUBLICATIONS

European Search Report dated Oct. 6, 2010 issued in corresponding European Patent Application No. EP 06 83 4499.

* cited by examiner

*Primary Examiner* — Tung S Lau
(74) *Attorney, Agent, or Firm* — Roberts Mlotkowski Safran & Cole P.C.

(57) ABSTRACT

A battery state judging method is provided capable of properly judging a state of a lead-acid battery by measuring voltages without measuring currents. A state of the battery is judged by obtaining, in advance, a DC internal resistance $r_0$ of a same type battery in a new and fully-charged state; calculating, in advance, a load R $[R=r_0 \times Vst_0/(OCV_0-Vst_0)]$ at an engine starting time (S112) from an open-circuit voltage $OCV_0$ (S104) and a lowest voltage $Vst_0$ (S108) at the engine starting time, both measured when the loaded battery is in a new and fully-charged state, and the DC internal resistance $r_0$; calculating a DC internal resistance r $[(r=R/(OCV-Vst)/Vst)]$ of the loaded battery from an open-circuit voltage OCV (S104) and a lowest voltage Vst (S108), both measured when the loaded battery is in a deteriorated/insufficiently-charged state, and the load R; and comparing r and $r_0$.

10 Claims, 4 Drawing Sheets

BATTERY STATE JUDGING METHOD, AND BATTERY STATE JUDGING APPARATUS

FIELD OF THE INVENTION

The present invention relates to a battery state judging method and a battery state judging apparatus, and more particularly, relates to a battery state judging method of a lead-acid battery loaded on a vehicle and a battery state judging apparatus that judges a state of a lead-acid battery loaded on a vehicle.

DESCRIPTION OF THE RELATED ART

A battery is a very important component loaded on a vehicle such as a gasoline engine vehicle, diesel engine vehicle or a like equipped with an internal combustion engine system, from a viewpoint of ensuring reliable starting of an engine. Therefore, the detection of a battery state such as a deteriorated state, state of health (SOH) or the like of the battery is useful in ensuring starting characteristics of the engine, and in particular a technology for accurately grasping a state of a battery is called for in recent years from viewpoints of enabling an idling stop and start (ISS) to reduce emissions, of regenerative charging and the like. A lead-acid battery is a representative battery applicable to these uses.

Attempts have been made hitherto to detect a state of a lead-acid battery by using various methods including the methods of measuring an open circuit voltage of the lead-acid battery, measuring its internal resistance by applying an alternating current, measuring its charging current, measuring its discharging current or the like. Further, in JP-A-2006-163129, a deterioration judging apparatus is disclosed which judges the deterioration of a battery loaded on a vehicle by measuring a voltage of a lead-acid battery appearing when a cell motor (starter) is started.

However, the open-circuit voltage measuring technology described above has problems in that a large discrepancy appears in the measurement and it is difficult to make a distinction between the lowering of a charged state of a lead-acid battery and the deterioration of the lead-acid battery. The technology for measuring an internal resistance by using an alternating current has also problems in that a large-scale and complicated measuring apparatus is required and it is difficult to accurately associate a measured resistance value with a state of a lead-acid battery. Moreover, the technology disclosed in the JP-A-2006-163129 which measures a charging current and discharging current has problems, though accuracy of measurements is increased owing to the measurement of the charging current and discharging current, in that a large current sensor is required to measure a large current, which brings possibilities of causing the sensor large and a cost thereof increased and that, since a current sensor has to be attached in a state in which the current sensor is intruded into a current harness in a vehicle, retrofitting of the current sensor to an ordinary vehicle is difficult.

SUMMARY OF THE INVENTION

In view of the above circumstances, an object of the present invention is to provide a battery state judging method and a battery state judging apparatus capable of properly judging a state of a lead-acid battery by measuring voltages without measuring currents.

In order to solve the above problems, a first aspect of the present invention is a battery state judging method of a lead-acid battery loaded on a vehicle, comprising the steps of: obtaining, in advance, a DC internal resistance $r_0$ of a lead-acid battery in a substantially non-deteriorated and fully-charged state; calculating, in advance, a load R imposed at an engine starting time, using a following Equation (1), from an open-circuit voltage $OCV_0$ and a lowest voltage $Vst_0$ at the engine starting time, both measured when the lead-acid battery is in a substantially non-deteriorated and fully-charged state, and the DC internal resistance $r_0$; calculating a DC internal resistance r of the lead-acid battery, using a following Equation (2), from an open-circuit voltage OCV and a lowest voltage Vst at an engine starting time, both measured when the lead-acid battery is in a deteriorated or insufficiently-charged state, and the calculated load R imposed at the engine starting time; and judging a state of the lead-acid battery by comparing the DC internal resistance r with the DC internal resistance $r_0$.

$$R = r_0 \times Vst_0 / (OCV_0 - Vst_0) \tag{1}$$

$$r = R \times (OCV - Vst) / Vst \tag{2}$$

In a vehicle, power is supplied from a lead-acid battery to rotate a cell motor for starting an engine. At the moment when an engine starts, a large current flows which causes a great drop in a voltage between terminals of a lead-acid battery. When a voltage drop and a change in currents with time are measured in this situation, as shown in FIG. 1, immediately after the current starts flowing to the cell motor, a sharp peak-like large current flows and, at the same time, a sharp valley-like drop occurs in the voltage between the terminals of the lead-acid battery. The lowest voltage value (lowest voltage at an engine starting time) Vst in the voltage drop appears when the current takes the maximum value Ist. When the relationship between the voltage Vst and the current Ist are studied on lead-acid batteries in various charged states and various deteriorated states, as shown in the following Equation (3), an Ohm's law simply holds between the voltage Vst and current Ist. Here, R is a load imposed at the engine starting time which varies depending on an engine, cell motor, or other components in the vehicle.

$$Vst = R \times Ist \tag{3}$$

Further, the following Equation (4) for the lead-acid battery itself holds, where OCV denotes an open-circuit voltage of the lead-acid battery and r denotes a DC internal resistance of the lead-acid battery.

$$OCV - Vst = r \times Ist \tag{4}$$

The following Equation (5) can be obtained from the Equations (3) and (4). Therefore, it is made possible to calculate the DC internal resistance r of the lead-acid battery from the open-circuit voltage OCV, the lowest voltage Vst at an engine starting time, and the load R imposed at the engine starting time. The Equation (5) holds not only in a new lead-acid battery whose SOH and State of Charge (SOC) both are 100% but also in a lead-acid battery whose SOC is lowered due to discharge or whose SOH and SOC are lowered due to use of the lead-acid battery.

$$r = R \times (OCV - Vst) / Vst \tag{5}$$

For actual application of the Equation (5), the determination of the load R imposed at the engine starting time is required. To do this, the current Ist has to be measured in the Equation (3), however, in this case, the problems described above occur. According to the present invention, by noting that an internal resistance of a lead-acid battery in a new and fully charged state (non-deteriorated and fully charged state) is almost constant in every lead-acid battery of the same type, the DC internal resistance of the lead-acid battery in a new and fully charged state is handled as a known value and the DC internal resistance of the lead-acid battery in a deteriorated state is calculated without measuring currents to make a proper deterioration judgment.

In the first aspect, a DC internal resistance of a lead-acid battery in a new and fully charged state is first obtained in advance. For example, a lead-acid battery of the same type in a new and fully charged state is discharged at each current value for a short duration and a DC internal resistance $r_0$ of the lead-acid battery in a new and fully charged state is calculated from a relation between a current and a voltage in the Equation (4). That is, between the open-circuit voltage $OCV_0$ of the lead-acid battery in a new and fully charged state and the DC internal resistance $r_0$, the following Equation (6) obtained by modifying the Equation (4) holds, and accordingly a voltage V between the terminals of the lead-acid battery is expressed as a straight line having a gradient of $-r_0$ and an intercept of $OCV_0$ relative to a current I flowing through the lead-acid battery, and thus the DC internal resistance $r_0$ can be calculated from the gradient.

$$V = -r_0 \times I + OCV_0 \qquad (6)$$

Next, a lead-acid battery in a new and fully charged state is loaded on a vehicle and a load R imposed at an engine starting time is calculated. The lead-acid battery is prepared so that its voltage can be measured in a state in which the battery is loaded on the vehicle. It is sufficient that a resolution and measurement time intervals for the voltage measurement are about +−10 mV and 1 ms, respectively. For the measurement, a low-priced digital recorder may be used. At a time of loading the lead-acid battery on the vehicle, an open-circuit voltage $OCV_0$ of the lead-acid battery in a new and fully charged state is measured, however, as long as the lead-acid battery is in a new and fully charged state, its open-circuit voltage is considered as being almost constant, and therefore, the open-circuit voltage may be measured in advance by using a lead-acid battery of the same type in a new and fully-charged state. Then, an engine is started while a voltage of the lead-acid battery is being measured. The lowest voltage at this engine starting time is referred to as $Vst_0$. By substituting the open-circuit voltage $OCV_0$, lowest voltage $Vst_0$ at the engine starting time, and DC internal resistance $r_0$ obtained in advance into the Equation (5), the load R imposed at the engine starting time can be calculated as shown in the following Equation (7).

$$R = r_0 \times Vst_0 / (OCV_0 - Vst_0) \qquad (7)$$

The load R imposed at the engine starting time calculated in the above steps is subject to a characteristic of a cell motor of a vehicle, characteristic of an electrical system and characteristic of an engine, but exhibits a specified value depending on a vehicle. Moreover, it has been found that the load R hardly changes in time. A DC internal resistance r of a deteriorated lead-acid battery can be calculated from the load R at the engine starting time by using the Equation (5). Therefore, an embodiment, of calculating the load R at the engine starting time of a vehicle to be used, and storing the load R into a memory as data, may be employed.

When a state of a deteriorated lead-acid battery is actually judged, according to the same procedure as the preparation made after the battery is loaded on the vehicle, an open-circuit voltage OCV of the deteriorated lead-acid battery may be measured and, further, a lowest voltage Vst at an engine starting time may be measured. By substituting the measured open-circuit voltage OCV, lowest voltage Vst at the engine starting time, load R at the engine starting time calculated by the Equation (7) into the Equation (5), a DC internal resistance r of the deteriorated lead-acid battery can be obtained as shown in the following Equation (8).

$$r = r_0 \times Vst_0 \times (OCV - Vst) / (OCV_0 - Vst_0) / Vst \qquad (8)$$

The DC internal resistance r obtained thus has a strong relationship with a SOH of a lead-acid battery and exhibits a minimum value when the lead-acid battery is in a non-deteriorated state, and increases as the deterioration of the lead-acid battery proceeds. Accordingly, by comparing the obtained DC internal resistance r with the DC internal resistance $r_0$, a state of the lead-acid battery can be judged. For example, by obtaining, in advance, a relationship between the DC internal resistance r and the SOH in the lead-acid battery with respect to a state thereof to be detected, the SOH of the lead-acid battery can be judged (estimated) from the DC internal resistance r. In order to simply estimate a deterioration degree of a lead-acid battery from the measured DC internal resistance r, a deteriorated state judging coefficient alpha represented as a value of the DC internal resistance r to that of the DC internal resistance $r_0$ of the lead-acid battery in a new and fully charged state may be introduced. When the deteriorated state judging coefficient alpha is not less than a predetermined value, the lead-acid battery is judged as having been deteriorated as its replacement being required.

In order to solve the above problems, a second aspect of the present invention is a battery state judging apparatus that judges a state of a lead-acid battery loaded on a vehicle, comprising: a storing means which stores, in advance, a DC internal resistance $r_0$ of a lead-acid battery obtained in a substantially non-deteriorated and fully-charged state; an open-circuit voltage measuring means which measures an open-circuit voltage of the lead-acid battery; a lowest voltage measuring means which measures a lowest voltage at an engine starting time of the lead-acid battery; a load calculating means which calculates a load R imposed at an engine starting time, using a following Equation (1), from an open-circuit voltage $OCV_0$ measured by the open-circuit voltage measuring means and a lowest voltage $Vst_0$ at the engine starting time measured by the lowest voltage measuring means, both measured when the lead-acid battery is in a substantially non-deteriorated and fully-charged state, and the DC internal resistance $r_0$ stored in the storing means; a DC internal resistance calculating means which calculates a DC internal resistance r of the lead-acid battery, using a following Equation (2), from an open-circuit voltage OCV measured by the open-circuit voltage measuring means and a lowest voltage Vst at an engine starting time measured by the lowest voltage measuring means, both measured when the lead-acid battery is in a deteriorated or insufficiently-charged state, and the load R imposed at the engine starting time calculated by the load calculating means; and a state judging means which judges a state of the lead-acid battery by comparing the DC internal resistance r calculated by the DC internal resistance calculating means with the DC internal resistance $r_0$ stored in the state storing means.

$$R = r_0 \times Vst_0 / (OCV_0 - Vst_0) \qquad (1)$$

$$r = R \times (OCV - Vst) / Vst \qquad (2)$$

In the second aspect, a DC internal resistance $r_0$ of a lead-acid battery in a substantially non-deteriorated and fully charged state is stored, in advance, to the storing means. The DC internal resistance $r_0$ is a value obtained using a lead-acid battery of the same type in a new and fully charged state (non-deteriorated and fully charged state) as described in the first aspect. The battery state judging apparatus has the open-circuit voltage measuring means which measures an open-circuit voltage of the lead-acid battery and the lowest voltage measuring means which measures a lowest voltage at an engine starting time of the lead-acid battery, and a load R imposed at an engine starting time is calculated by the load calculating means, using the following Equation (1), from an open-circuit voltage $OCV_0$ measured by the open-circuit voltage measuring means and a lowest voltage $Vst_0$ at the engine starting time measured by the lowest voltage measuring means, both measured when the lead-acid battery is in a substantially non-deteriorated and fully-charged state, and the DC internal resistance $r_0$ stored in the storing means, and the calculated load R at the engine starting time is stored in the storing means. The storing means is preferably a nonvolatile memory. A DC internal resistance r of the lead-acid battery is calculated by the DC internal resistance calculating means, using the following Equation (2), from an open-circuit voltage OCV measured by the open-circuit voltage measuring means and a lowest voltage Vst at an engine starting time measured by the lowest voltage measuring means, both measured when the lead-acid battery is in a deteriorated or insufficiently-charged state, and the load R imposed at the engine starting time calculated by the load calculating means. Then, the DC internal resistance r calculated by the DC internal resistance calculating means is compared with the DC internal resistance $r_0$ stored in the storing means by the state judging means to judge a state of the lead-acid battery.

In the second aspect, a map or expression showing a correspondence relationship between a deteriorated state judging coefficient alpha represented as a value of the DC internal resistance r to that of the DC internal resistance $r_0$ and a SOH of the lead-acid battery may be stored in advance to the storing means, and the state judging means may calculate the deteriorated state judging coefficient alpha and calculates the SOH from the correspondence relationship between a deteriorated state judging coefficient alpha and a SOH of the lead-acid battery according to the map or expression stored in the storing means. Moreover, when the deteriorated state judging coefficient alpha is not less than a predetermined value, the state judging means may judge that replacement of the lead-acid battery is required.

According to the present invention, effects can be obtained that a state of a lead-acid battery can be judged properly only by measuring voltages (open-circuit voltage OCV and lowest voltage Vst at the engine starting time) of the lead-acid battery in a deteriorated or insufficiently-charged state.

DETAILED DESCRIPTION OF THE PREFERRED EMBODIMENTS

An embodiment of the battery state judging apparatus of the present invention will be described hereinafter. In this embodiment, constitution and data for a lead-acid battery having a 55D23 size defined by the JIS (Japanese Industrial Standard) and being loaded on a gasoline engine vehicle of a displacement of 2000 cc having an electrically-controlled fuel injection equipment are described, however, the present invention is not limited to this.

(Constitution)

Figure 2:
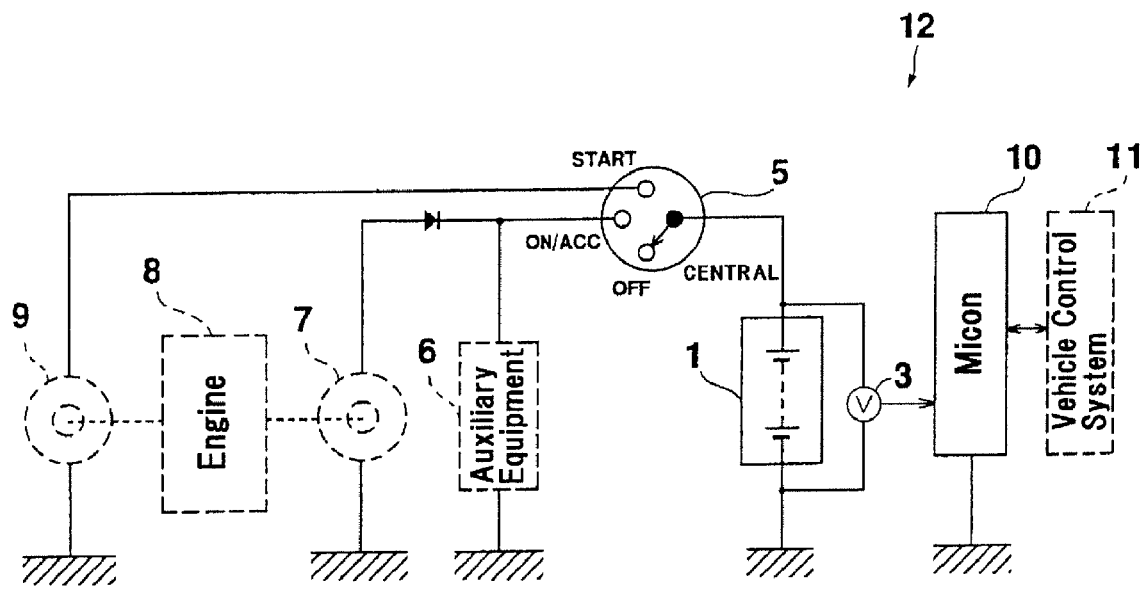
FIG. 2 is a block wiring diagram showing a battery state judging apparatus of an embodiment to which the present invention is applicable and the vehicle.

As shown in FIG. 2, the battery state judging apparatus 12 of this embodiment comprises a voltage sensor 3, having a differential amplifier circuit and the like, which serves as a part of an open-circuit voltage measuring means and a part of a lowest voltage measuring means and which measures a voltage between terminals of the lead-acid battery 1; and a microcomputer (hereinafter, referred to as micon) 10 which judges a state of the lead-acid battery 1 and which serves as a storing means, a load calculating means, a DC (Direct Current) internal resistance calculating means and a state judging means.

The lead-acid battery 1 has an approximately rectangular battery case as a battery container. As a material for the battery case, polymer resin can be selected such as acrylic butadiene styrene (ABS), polypropylene (PP), polyethylene (PE) or the like which is excellent in a forming property, electrical insulation property, erosion resistance property, endurance property and the like. Six sets of electrode groups in total are housed in the battery case. In each of the electrode groups, a plurality of negative electrode plates and a plurality of positive electrode plates are stacked in layers via separators, and a cell voltage is set to 2.0V. Therefore, a nominal voltage of the lead-acid battery is 12V. An upper portion of the battery case is bonded or welded to an upper cap made of polymer resin such as ABS, PP, PE or the like which seals the upper aperture of the battery case. A positive external output terminal and a negative external output terminal are erected on the upper cap in order to supply power to the outside of the lead-acid battery as a power source.

The positive external output terminal of the lead-acid battery 1 is connected to a central terminal of the ignition switch (hereinafter, referred to as IGN switch) 5. The IGN switch 5, in addition to its central terminal, has an OFF terminal, ON/ACC terminal and a START terminal and the central terminal can be connected to any one of these terminals so as to be switched in a rotary manner.

The START terminal is connected to a cell motor (starter) 9 for starting an engine. The cell motor 9 can convey rotation driving force to a rotation shaft of an engine 8 via an unillustrated clutch mechanism.

Further, the ON/ACC terminal is connected to an auxiliary equipment 6 such as an air conditioner, radio, lamp (s) and the like, and to a generator 7 for generating power due to rotation of the engine 8 via a diode that allows current flow in one direction. That is, an anode of the diode is connected to one terminal of the generator 7 and a cathode of the diode is connected to the ON/ACC terminal. A rotation shaft of the engine 8 can convey force to the generator 7 via an unillustrated clutch mechanism. Therefore, while the engine 8 is in a rotation state, the generator 7 operates via the unillustrated clutch mechanism to supply power out of the generator 7 to the auxiliary equipment 6 and the lead-acid battery 1 (for charging the battery). Incidentally, the OFF terminal is not connected to any one of the above components.

The external output terminals of the lead-acid battery 1 are connected to the voltage sensor 3, and the output terminal sides of the voltage sensor 3 are connected to an A/D converter embedded in the micon 10. As a result, the micon 10 can fetch the voltage of the lead-acid battery 1 as a digital voltage value.

The micon 10 is configured to include a CPU which functions as a central processing unit, a ROM which stores a basic control program of the battery state judging apparatus 12 and program data such as maps, expressions and data as described later and which serves as a part of a storing means, a RAM which functions as a work area for the CPU and temporarily stores data and the like. Further, an external bus is connected to an unillustrated EEPROM (nonvolatile memory) which serves as a part of a storing means. Another terminal of each of the generator 7, cell motor 9 and auxiliary equipment 6, as well as the negative external output terminal of the lead-acid battery 1 and the micon are connected to the ground. Incidentally, in the micon 10 of the embodiment, voltages appearing at an engine starting time are sampled every interval of 1 ms, and the sampled results are stored in the RAM.

In the ROM of the micon 10, data of a DC internal resistance $r_0$ measured with a lead-acid battery of the same type as the lead-acid battery 1 (hereinafter, referred to as the same type battery) in a new and fully-charged state (non-deteriorated and fully-charged state) is stored. The DC internal resistance $r_0$ can be calculated from a relationship between a discharged current I and a battery voltage V obtained by, for example, changing the levels of currents of the same type battery from 50A to 500A to discharge it with a constant current for 5 seconds. Between an open-circuit voltage $OCV_0$ and a DC internal resistance $r_0$ of the same type battery, the Equation of $V=-r_0 \times I+OCV_0$ holds, and therefore, a straight line having a gradient $-r_0$ of the battery voltage V to the discharge current I and an intercept of $OCV_0$ is obtained. According to the embodiment, the DC internal resistance $r_0$ is calculated from the gradient of the straight line and the calculated value is stored in the ROM as data of the DC internal resistance $r_0$.

(Operation)

Figure 3:
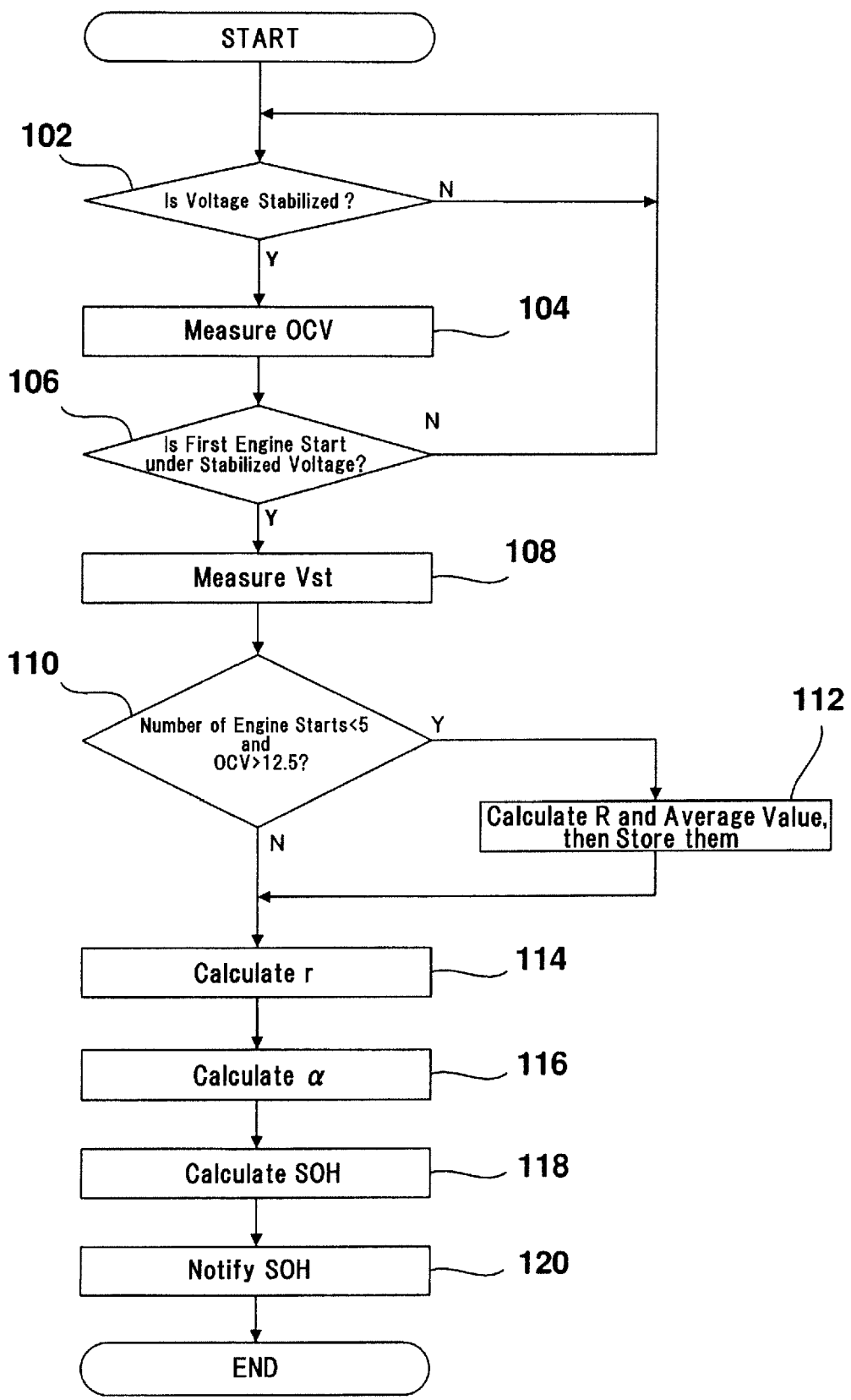
FIG. 3 is a flowchart of a battery state judging routine executed by a CPU of a micon in the battery state judging apparatus according to the embodiment.

Next, with reference to the flowchart, the operation of the battery state judging apparatus 12 of the embodiment will be described with the CPU of the micon 10 being a main object. When power is supplied to the micon, as shown in FIG. 3, the CPU executes a battery state judging routine for judging a state of the lead-acid battery 1. Incidentally, a program and program data stored in the ROM are developed to the RAM according to an unillustrated initial setting process which is carried out after power is supplied to the micon 10.

In this battery state judging routine, in step 102, the CPU awaits until a voltage of the lead-acid battery 1 is stabilized because a state of polarization being dispelled is not obtained due to that discharge polarization is accumulated during the lead-acid battery 1 is discharged (during a vehicle is in operation). That is, by judging whether or not a predetermined time (e.g., 6 hours) has elapsed after stopping of the engine, the CPU determines whether or not the voltage of the lead-acid battery 1 is stabilized. Whether or not the engine 8 is stopped may be judged by notification provided from, for example, the vehicle control system 11 or may be judged on the micon 10 side by monitoring a voltage of the lead-acid battery 1 measured by the voltage sensor 3.

In next step 104, the CPU measures an open-circuit voltage OCV of the lead-acid battery 1. That is, the CPU fetches the voltage of the lead-acid battery 1 outputted from the voltage sensor 3 as the digital value via the A/D converter. Subsequently, in step 106, the CPU judges whether or not the engine is started for the first time after the voltage of the lead-acid battery 1 has been stabilized. When a negative judgment is made, the routine returns back to the step 102, while when an affirmative judgment is made, the CPU measures the lowest voltage Vst at the engine starting time in step 108. Because the micon 10 samples the voltage of the lead-acid battery 1 at the engine starting time every interval of 1 ms and stores the obtained voltages into the RAM as described above, the CPU can determine a minimum voltage as the lowest voltage at the engine staring time among the obtained voltage values stored in the RAM which are lower than a predetermined value (e.g., 9V).

In next step 110, the CPU judges whether or not the number of times of the engine starting is less than 5 and the open-circuit voltage OCV exceeds 12.5V. When an affirmative judgment is made, because the open-circuit voltage OCV measured in step 104 and the lowest voltage Vst at the engine starting time measured in step 108 are considered as the open-circuit voltage $OCV_0$ of the lead-acid battery 1 in a new and fully-charged state and the lowest voltage $Vst_0$ at the engine starting time, respectively, and in step 112, the CPU calculates the load R imposed at an engine starting time by substituting the DC internal resistance $r_0$ stored in the ROM (and developed to the RAM), together with the voltages OCV and Vst, into Equation (1), and then stores the calculated value into the EEPROM.

$$R=r_0 \times Vst_0/(OCV_0-Vst_0) \quad (1)$$

Further, in step 112, the CPU reads out the load R imposed at the engine starting time stored in the EEPROM to calculate an average value of the load(s) R imposed at the engine starting time(s), and then stores the calculated average value into the EEPROM. Thus, to the end, an average value of a plurality of the loads R at the engine starting time in the new and fully-charged state of the lead-acid battery 1 is calculated and it is stored in the EEPROM.

On the other hand, when a negative judgment is made in step 110, the CPU calculates a DC internal resistance r of the lead-acid battery 1 (DC internal resistance of the lead-acid battery in a deteriorated or insufficiently-charged state changed from the new and fully-charged state) in step 114, by substituting the open-circuit voltage OCV measured in step 104, the lowest voltage Vst at an engine starting time measured in step 108 and the average value of the load R imposed at the engine starting time stored in the EEPROM in step 112 into the following Equation (2).

$$r=R \times (OCV-Vst)/Vst \quad (2)$$

Figure 5:
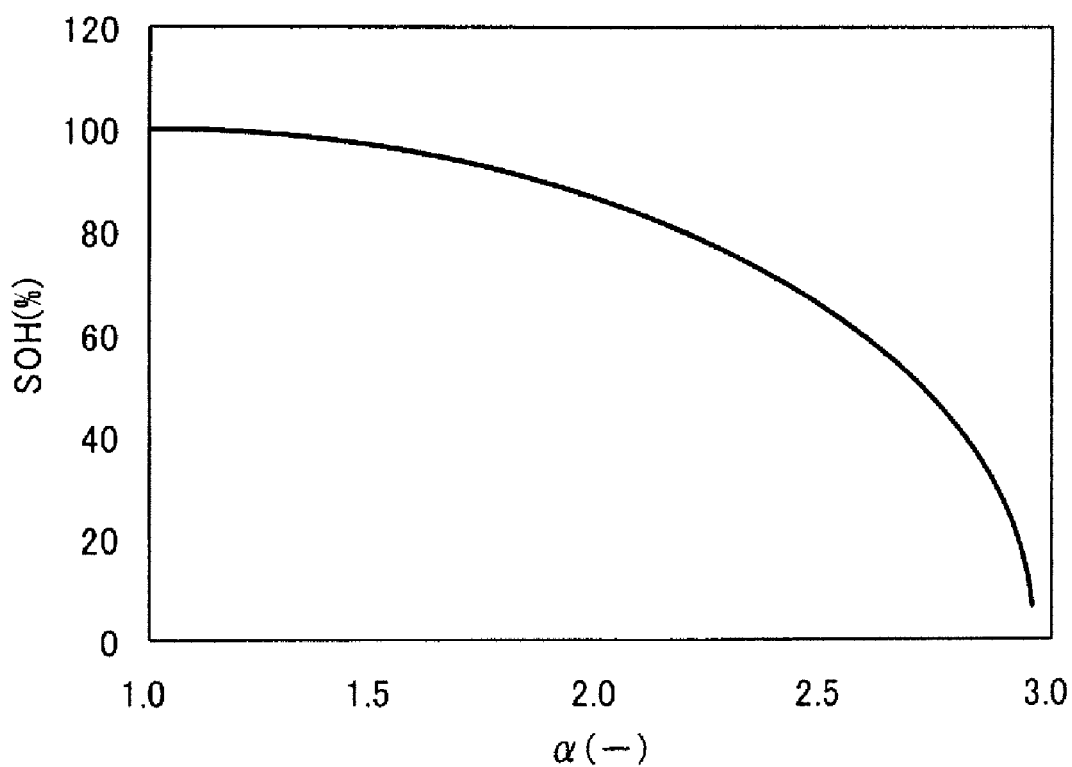
FIG. 5 is a graph showing a relationship map between a deteriorated state judging coefficient and a state of health.

Next, the CPU calculates a deteriorated state judging coefficient alpha (in the embodiment, alpha=$r/r_0$) which is represented as a value of the DC internal resistance r to that of the DC internal resistance $r_0$ in step 116, and calculates a SOH of the lead-acid battery 1 in step 118 by using a map (See FIG. 5.), showing a correspondence between a deteriorated state judging coefficient alpha and a SOH of the lead-acid battery 1, which is stored in the ROM (and developed to the RAM). Such a map can be obtained by measuring a correspondence relationship between deteriorated state judging coefficients alpha and SOHs in the same type batteries. Incidentally, the SOH map shown in FIG. 5 is obtained by calculating the deteriorated state judging coefficient alpha (alpha=$r/r_0$) and a 5 hour rate capacity of the lead-acid battery 1 (JIS 55D23).

In next step 120, the CPU notifies the vehicle control system 11 of the SOH of the lead-acid battery to terminate the battery state judging routine. Incidentally, in FIG. 3, for a simple explanation, the example is shown in which the battery state judging routine is terminated with the process in step 120, however, in actuality, the routine returns back to step 102 to make the CPU continue judging the battery state of the lead-acid battery 1. (The same holds true to FIG. 4 described later.)

The vehicle control system 11 notified of the SOH of the lead-acid battery 1 displays the SOH of the lead-acid battery 1, for example, using a level meter (bar graph display) on an installment panel. This enables a driver to recognize the SOH of the lead-acid battery 1 and, if necessary, to replace the lead-acid battery 1 at a service station or a like for vehicles.

Figure 4:
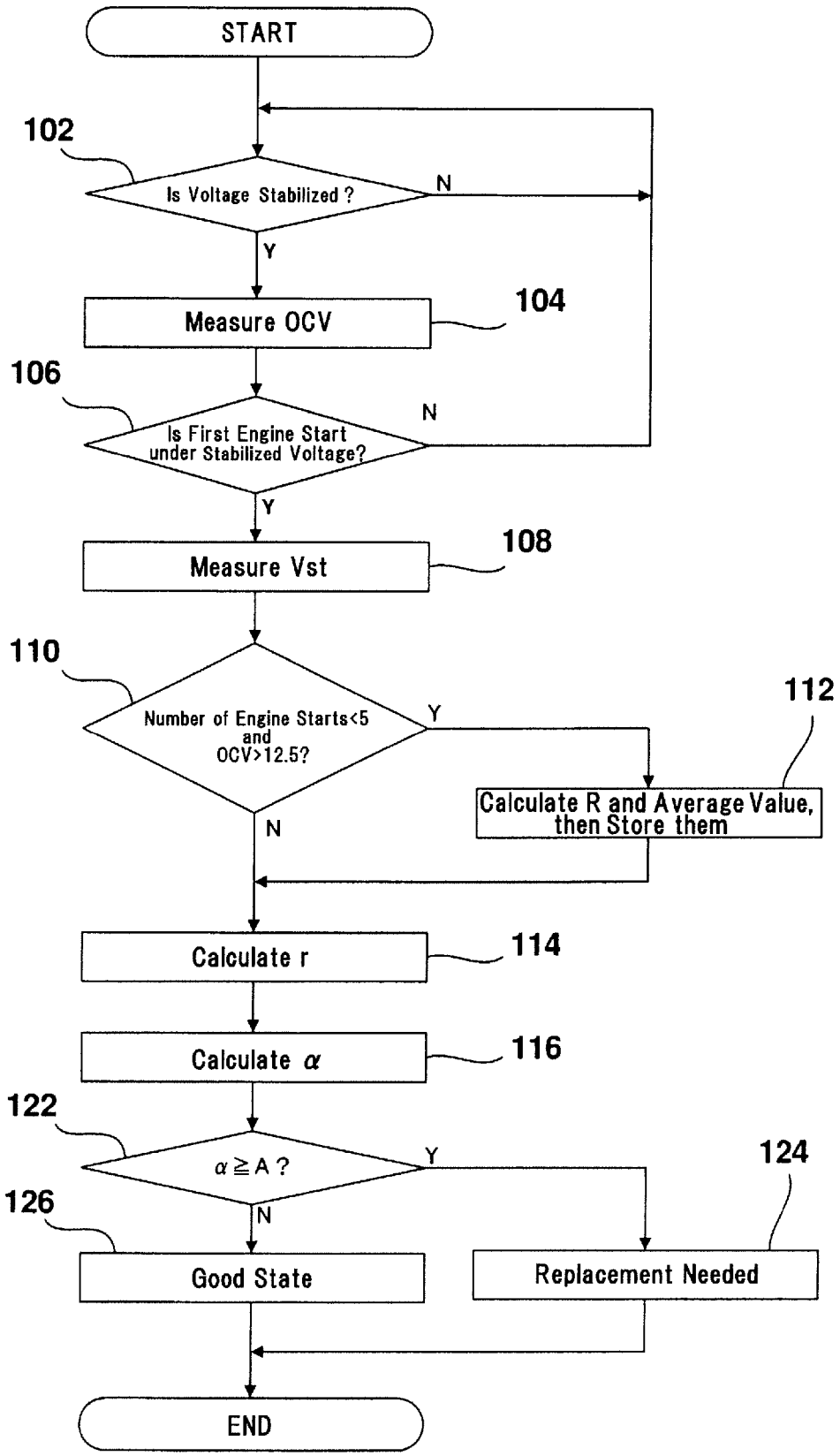
FIG. 4 is a flowchart of another battery state judging routine being able to be executed by the CPU of the micon in the battery state judging apparatus according to the embodiment.

Further, the battery state judging apparatus 12 may perform processes in steps 122 to 126 in FIG. 4 instead of steps 118 and 120 shown in FIG. 3. In such an embodiment, the CPU judges whether or not the deteriorated state judging coefficient alpha is not less than a constant A. In the embodiment, the constant A is set at 2.8, which corresponds to approximately 40% of the SOH shown in FIG. 5. When a negative judgment is made, the CPU notifies the vehicle control system 11 that the lead-acid battery 1 is in a good state in step 124, while when an affirmative judgment is made, the CPU notifies the vehicle control system 11 that replacement of the lead-acid battery 1 is required in step 126, and then the battery state judging routine is terminated. The vehicle control system 11 notified of the SOH of the lead-acid battery 1 displays that the lead-acid battery 1 is in a good state or that the replacement of the lead-acid battery 1 is required on the installment panel. Therefore, in step 120 in FIG. 3, the CPU may notify the vehicle control system 11 of not only the SOH of the lead-acid battery but also the necessity of its replacement.

(Effects and the Like)

Next, operation, effects and the like of the battery state judging apparatus 12 in this embodiment will be described.

Figure 1:
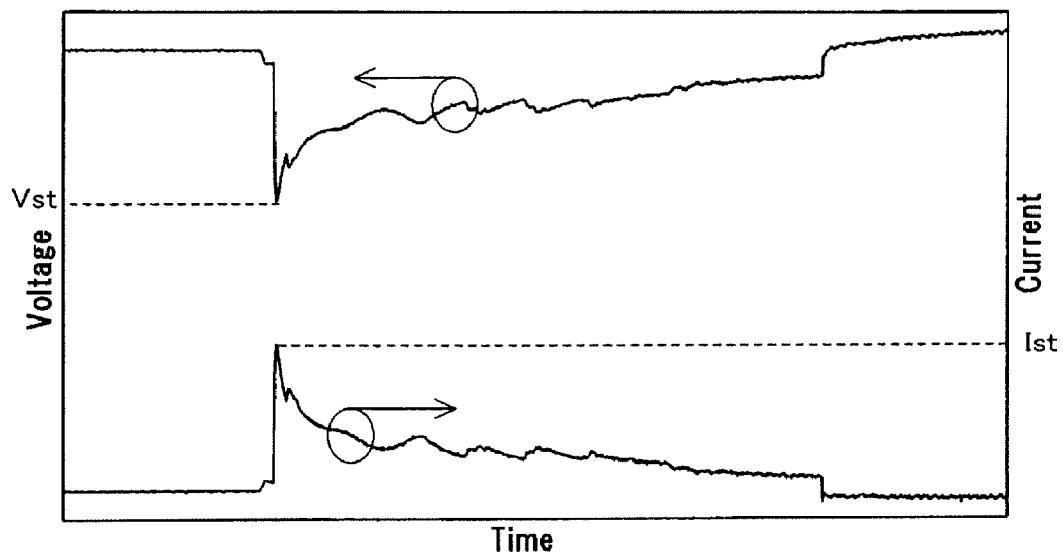
FIG. 1 is a graph showing a voltage between terminals of a lead-acid battery and a current flowing through a cell motor at an engine starting time in a gasoline engine vehicle.

As shown in FIG. 1, when an engine starts, Equation (3) holds among the load R imposed at the engine starting time, lowest voltage Vst at the engine starting time, and maximum current value Ist at the engine starting time, while Equation (4) holds between the open-circuit voltage OCV of the lead-acid battery and DC internal resistance r of the lead-acid battery. Therefore, the DC internal resistance r of the lead-acid battery can be calculated from Equation (5). In this embodiment, by noting that the internal resistance of the lead-acid battery in the new and fully-charged state (non-deteriorated and fully-charged state) is almost constant in every battery of the same type, as described above, the same type battery in the new and fully-charged state is discharged at each current for the short duration to calculate the DC internal resistance $r_0$ of the lead-acid battery in the new and fully-charged state from the relation $(V=-r_0 \times I+OCV_0)$ between the current and voltage in the Equation (4), and then the calculated value is stored into the ROM of the micon 10.

$$Vst = R \times Ist \quad (3)$$

$$OCV - Vst = r \times Ist \quad (4)$$

$$r = R \times (OCV - Vst)/Vst \quad (5)$$

When the DC internal resistance r is to be calculated by using the Equation (5), it is necessary that the load R being imposed at the engine starting time is obtained. In the battery state judging apparatus 12 of this embodiment, the load R (average value of the loads R) imposed at the engine starting time of the lead-acid battery 1 loaded on a vehicle is calculated while the lead-acid battery 1 is in the new and fully-charged state by using the above Equation (1) and the obtained load R is stored in the EEPROM (step 112) in advance, and then the DC internal resistance r of the lead-acid battery 1 in the deteriorated or insufficiently-charged state is calculated (step 114) and the calculated DC internal resistance r is compared with the DC internal resistance $r_0$ of the lead-acid battery in the new and fully-charged state to judge the state of the lead-acid battery 1 (steps 116 to 120 in FIG. 3 and steps 116 to 126 in FIG. 4).

Therefore, when the state of the lead-acid battery 1 in the deteriorated or insufficiently-charged state is to be judged, the state of the lead-acid battery 1 can be properly determined only by measuring the voltages of the lead-acid battery 1 (measurement of the open-circuit voltage OCV in step 104 and the lowest voltage Vst at the engine starting time in step 108), and accordingly, a high-priced current sensor or complicated AC internal resistance meter is not required. Moreover, the DC internal resistance r calculated according to this embodiment is nearer to a resistance value of a lead-acid battery in actual use comparing with an internal resistance obtained by using an alternating current method, which enables a highly reliable judgment.

Incidentally, in this embodiment, the example was shown that the coefficient $r/r_0$ is employed as the deteriorated state judging coefficient alpha, however, the present invention is not limited to this. For example, depending on a style of use of the lead-acid battery, alpha$=\log(r/r_0)$, alpha$=(r-r_0) r_0$ or the like may be employed as the deteriorated state judging coefficient alpha. Furthermore, in this embodiment, as shown in FIG. 5, the map showing the relationship between the deteriorated state judging coefficient alpha and the SOH was shown, however, an expression(s) may be used instead.

Furthermore, in the above embodiment, one example was shown in which, in steps 122 to 126 in FIG. 4, whether or not the state of the lead-acid battery 1 is in the good state or requires its replacement is determined by one level judgment, however, a plurality of judgment levels for the determination may be employed, that is, for example, whether or not alpha >=A1 (e.g., the predetermined value A1 is set at 2.5) is judged and, in the case of an affirmative judgment, it is determined that the lead-acid battery 1 should be replaced and, in the case of a negative judgment, whether or not alpha >=A2 (e.g., the predetermined value A1 is set at 2.8) is judged and, in the case of an affirmative judgment, it is determined that the lead-acid battery 1 is in an attention needed state and, in the case of a negative judgment, it is determined that the battery is in a good state.

INDUSTRIAL APPLICABILITY

The present invention provides the battery state judging method and the battery state judging apparatus capable of properly judging the state of the lead-acid battery by measuring voltages without measuring currents, which contributes to sales and manufacture of the battery state judging apparatus, and accordingly, the present invention has industrial applicability.

What is claimed is:

1. A battery state judging method of a lead-acid battery loaded on a vehicle, comprising the steps of:
   obtaining, in advance, a DC internal resistance $r_0$ of a lead-acid battery in a substantially non-deteriorated and fully-charged state;
   calculating, in advance, a load R imposed at an engine starting time, using a following Equation (1), from an open-circuit voltage $OCV_0$ and a lowest voltage $Vst_0$ at the engine starting time, both measured when the lead-acid battery is in a substantially non-deteriorated and fully-charged state, and the DC internal resistance $r_0$;
   calculating a DC internal resistance r of the lead-acid battery, using a following Equation (2), from an open-circuit voltage OCV and a lowest voltage Vst at an engine starting time, both measured when the lead-acid battery is in a deteriorated or insufficiently-charged state, and the calculated load R imposed at the engine starting time; and judging a state of the lead-acid battery by comparing the DC internal resistance r with the DC internal resistance $r_0$;

$$R = r_0 \times Vst_0/(OCV_0 - Vst_0) \quad (1)$$

$$r = R \times (OCV - Vst)/Vst \quad (2).$$

2. The battery state judging method according to claim 1, wherein, in the step of judging a state of the lead-acid battery, a deteriorated state judging coefficient alpha represented as a value of the DC internal resistance r to that of the DC internal resistance $r_0$ is calculated, and a state of health (SOH) of the lead-acid battery is calculated from a predetermined correspondence relationship between a deteriorated state judging coefficient alpha and a SOH of the lead-acid battery.

3. The battery state judging method according to claim 2, wherein, in the step of judging a state of the lead-acid battery, it is judged that replacement of the lead-acid battery is required when the deteriorated state judging coefficient alpha represented as a value of the DC internal resistance r to that of the DC internal resistance $r_0$ is not less than a predetermined value.

4. A battery state judging apparatus that judges a state of a lead-acid battery loaded on a vehicle, comprising:
a storing means which stores, in advance, a DC internal resistance $r_0$ of a lead-acid battery obtained in a substantially non-deteriorated and fully-charged state;
an open-circuit voltage measuring means which measures an open-circuit voltage of the lead-acid battery;
a lowest voltage measuring means which measures a lowest voltage at an engine starting time of the lead-acid battery;
a load calculating means which calculates a load R imposed at an engine starting time, using a following Equation (1), from an open-circuit voltage $OCV_0$ measured by the open-circuit voltage measuring means and a lowest voltage $Vst_0$ at the engine starting time measured by the lowest voltage measuring means, both measured when the lead-acid battery is in a substantially non-deteriorated and fully-charged state, and the DC internal resistance $r_0$ stored in the storing means;
a DC internal resistance calculating means which calculates a DC internal resistance r of the lead-acid battery, using a following Equation (2), from an open-circuit voltage OCV measured by the open-circuit voltage measuring means and a lowest voltage Vst at an engine starting time measured by the lowest voltage measuring means, both measured when the lead-acid battery is in a deteriorated or insufficiently-charged state, and the load R imposed at the engine starting time calculated by the load calculating means; and
a state judging means which judges a state of the lead-acid battery by comparing the DC internal resistance r calculated by the DC internal resistance calculating means with the DC internal resistance $r_0$ stored in the state storing means;

$$R = r_0 \times Vst_0/(OCV_0 - Vst_0) \quad (1)$$

$$r = R \times (OCV - Vst)/Vst \quad (2).$$

5. The battery state judging apparatus according to claim 4, wherein the storing means further stores, in advance, a map or expression showing a correspondence relationship between a deteriorated state judging coefficient alpha represented as a value of the DC internal resistance r to that of the DC internal resistance $r_0$ and a SOH of the lead-acid battery, and wherein the state judging means calculates the deteriorated state judging coefficient alpha, and calculates the SOH from the correspondence relationship between a deteriorated state judging coefficient alpha and a SOH of the lead-acid battery according to the map or expression stored in the storing unit.

6. The battery state judging apparatus according to claim 5, wherein the state judging means judges that replacement of the lead-acid battery is required when the deteriorated state judging coefficient alpha represented as a value of the DC internal resistance r to that of the DC internal resistance $r_0$ is not less than a predetermined value.

7. The battery state judging apparatus according to claim 5, wherein the load calculating means makes the storing means store the calculated load R imposed at the engine starting time, and wherein the DC internal resistance calculating means calculates the DC internal resistance r of the lead-acid battery, using the Equation (2), from the open-circuit voltage OCV measured by the open-circuit voltage measuring means and the lowest voltage Vst at the engine starting time measured by the lowest voltage measuring means, both measured when the lead-acid battery is in a deteriorated or insufficiently-charged state, and the load R imposed at the engine starting time calculated by the load calculating means.

8. The battery state judging apparatus according to claim 7, wherein the storing unit is a nonvolatile memory.

9. The battery state judging apparatus according to claim 4, wherein the DC internal resistance $r_0$ stored in the storing means is obtained from a relationship equation of $V = -r_0 \times I + OCV_0$ standing up between a voltage V and a current I, which holds when a lead-acid battery (open-circuit voltage $OCV_0$) in a non-deteriorated and fully-charged state of the same type as the lead-acid battery loaded on the vehicle is discharged at a plurality of current values.

10. The battery state judging apparatus according to claim 4, wherein the load calculating means judges, when the number of times of the engine starting is less than 5 and the open-circuit voltage $OCV_0$ exceeds 12.5V, that the lead-acid battery is in the substantially non-deteriorated and fully-charged state and calculates the load R imposed at the engine starting time.

* * * * *